United States Patent
Iijima

(10) Patent No.: US 10,951,198 B1
(45) Date of Patent: Mar. 16, 2021

(54) SEMICONDUCTOR INTEGRATED CIRCUIT, TRANSMISSION DEVICE, AND MEMORY DEVICE

(71) Applicant: Kioxia Corporation, Minato-ku (JP)

(72) Inventor: Hiroaki Iijima, Yokohama (JP)

(73) Assignee: Kioxia Corporation, Minato-ku (JP)

( * ) Notice: Subject to any disclaimer, the term of this patent is extended or adjusted under 35 U.S.C. 154(b) by 0 days.

(21) Appl. No.: 16/795,677

(22) Filed: Feb. 20, 2020

(30) Foreign Application Priority Data

Sep. 18, 2019 (JP) .............................. JP2019-169018

(51) Int. Cl.
| | |
|---|---|
| *H03K 3/017* | (2006.01) |
| *G11C 7/22* | (2006.01) |
| *G11C 7/10* | (2006.01) |
| *G11C 16/26* | (2006.01) |
| *G11C 16/10* | (2006.01) |
| *G11C 16/32* | (2006.01) |

(52) U.S. Cl.
CPC .......... *H03K 3/017* (2013.01); *G11C 7/1051* (2013.01); *G11C 7/22* (2013.01); *G11C 7/222* (2013.01); *G11C 16/10* (2013.01); *G11C 16/26* (2013.01); *G11C 16/32* (2013.01)

(58) Field of Classification Search
CPC .......... H03K 3/017; G11C 7/22; G11C 7/222; G11C 7/1051
USPC ....................................... 365/233.12, 233.13
See application file for complete search history.

(56) References Cited

U.S. PATENT DOCUMENTS

| | | | |
|---|---|---|---|
| 8,487,680 B1 * | 7/2013 | Chung ................ | H03K 5/1565 327/175 |
| 8,730,757 B2 | 5/2014 | Shimizu | |
| 9,444,442 B2 * | 9/2016 | Chandrasekaran .. | H03K 5/1565 |
| 2018/0350414 A1 | 12/2018 | Park et al. | |
| 2019/0081631 A1 | 3/2019 | Nakata | |
| 2019/0228826 A1 | 7/2019 | Yamamoto et al. | |

FOREIGN PATENT DOCUMENTS

| | | |
|---|---|---|
| JP | 4158564 B2 | 10/2008 |
| JP | 2013-200830 A | 10/2013 |
| JP | 6203631 B2 | 9/2017 |
| JP | 2018-206389 A | 12/2018 |
| JP | 2019-050528 A | 3/2019 |
| JP | 2019-128829 A | 8/2019 |

* cited by examiner

*Primary Examiner* — Son L Mai
(74) *Attorney, Agent, or Firm* — Oblon, McClelland, Maier & Neustadt, L.L.P.

(57) ABSTRACT

According to one embodiment, a semiconductor integrated circuit includes a clock supply circuit, a first output circuit, and a second output circuit. The clock supply circuit outputs a first clock and a second clock, the first clock having a first period, the second clock having a second period that is 1/m times the first period. The m is a natural number of 2 or more. The first output circuit outputs a first signal indicating content of data to an outside when a first operation is performed and outputs a second signal having a toggle pattern based on the first clock to the outside when a second operation is performed. The second output circuit outputs an operation clock based on the first clock to the outside when the first operation is performed and outputs a sampling clock based on the second clock to the outside when the second operation is performed.

20 Claims, 11 Drawing Sheets

(1) DETECTION IN NAND Phy (a) DETECTION BY DCD1

SEMICONDUCTOR INTEGRATED CIRCUIT, TRANSMISSION DEVICE, AND MEMORY DEVICE

CROSS-REFERENCE TO RELATED APPLICATION

This application is based upon and claims the benefit of priority from Japanese Patent Application No. 2019-169018, filed Sep. 18, 2019; the entire contents of which are incorporated herein by reference.

FIELD

Embodiments described herein relate generally to a semiconductor integrated circuit, a transmission device, and a memory device.

BACKGROUND

A semiconductor integrated circuit capable of adjusting a duty ratio of a signal to be transmitted is known. Incidentally, improvement in quality including the duty ratio of signals transmitted by semiconductor integrated circuits is expected.

DETAILED DESCRIPTION

According to one embodiment, a semiconductor integrated circuit includes a clock supply circuit, a first output circuit and a second output circuit. The clock supply circuit outputs a first clock and a second clock, the first clock having a first period, the second clock having a second period that is 1/m times the first period. The m is a natural number of 2 or more. The first output circuit outputs a first signal indicating content of data to an outside when a first operation is performed and outputs a second signal having a toggle pattern based on the first clock to the outside when a second operation is performed. The second output circuit outputs an operation clock based on the first clock to the outside when the first operation is performed and outputs a sampling clock based on the second clock to the outside when the second operation is performed.

Hereinafter, a semiconductor integrated circuit, a transmission device, and a memory device according to embodiments will be described with reference to the drawings. In the following description, the same reference signs are given to components having the same or similar functions. Redundant description of such components may be omitted. In the present embodiments, "based on XX" means "based on at least XX" and includes being based on another element in addition to XX. "Based on XX" is not limited to the case where XX is directly used and also includes being based on a result of an operation or processing performed on XX. "XX" is a certain element (for example, certain information). In the present embodiments, "connection" is not limited to mechanical connection and also includes electrical connection.

The memory device includes a NAND device and a memory controller that controls the NAND device. A NAND Phy included in the memory controller is configured to be able to correct a duty and a phase of a signal transmitted from the memory controller to the NAND device. The "phase" corresponds to a timing of rising (or falling) of an edge of a pulse-like signal. Here, the signal transmitted from the memory controller to the NAND device may deteriorate in a transmission line between the memory controller and the NAND device, a signal wiring in the NAND device, a receiver circuit in the NAND device, or the like. In this case, even if the memory controller corrects the duty and phase of signals, the NAND device may not be able to process signals with high accuracy.

Therefore, in a memory device according to an embodiment, a duty and/or phase of a signal transmitted from a memory controller to a NAND device is corrected based on a result of determining the duty and/or phase of the signal in the NAND device. This can improve a quality of the signal in the NAND device. Hereinafter, such a memory device will be described. However, a present invention is not limited to the embodiments described below.

First Embodiment

<1. Overall Configuration of Memory Device>

Figure 1:
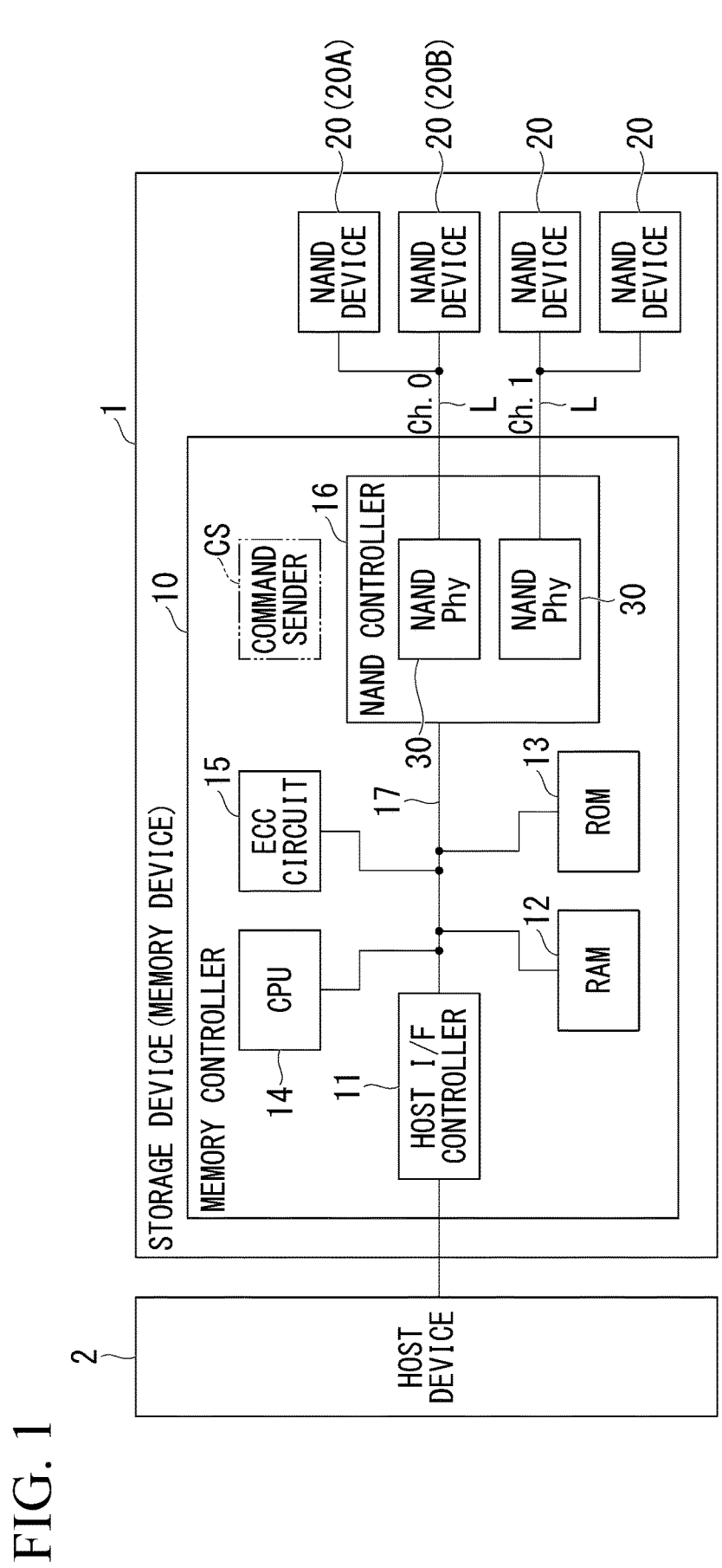
FIG. 1 is a block diagram showing a configuration of a memory device in a first embodiment.

FIG. 1 is a block diagram showing a configuration of a memory device 1 in a first embodiment. The memory device 1 is, for example, a storage device and is connected to a host device 2. The memory device 1 functions as an external memory device for the host device 2. The host device 2 is, for example, a server device, a personal computer, or a mobile information processing device.

The host device 2 can issue access requests (for example, a read request and a write request) to the memory device 1.

The memory device 1 includes, for example, a memory controller 10 and a plurality of NAND devices 20. The memory controller 10 is an example of a "controller." Each NAND device 20 is an example of a "semiconductor memory device."

The memory controller 10 includes, for example, a host interface (also referred to as I/F) controller 11, a random access memory (also referred to as RAM) 12, a read only memory (also referred to as ROM) 13, a central processing unit (also referred to as CPU) 14, an error correcting code (also referred to as ECC) circuit 15, and a NAND controller 16. These components are connected to each other by a bus 17.

For example, the memory controller 10 is constituted by a system on a chip (also referred to as SoC) in which such components are combined into one chip. However, some of the host I/F controller 11, the RAM 12, the ROM 13, the CPU 14, the ECC circuit 15, and the NAND controller 16 may be provided outside the memory controller 10. One or more of the RAM 12, the ROM 13, the CPU 14, and the ECC circuit 15 may also be provided inside the NAND controller 16.

The host I/F controller 11 performs control of a communication interface between the host device 2 and the memory device 1 and control of data transfer between the host device 2 and the RAM 12 under the control of the CPU 14.

The RAM 12 is, for example, but not limited to, a synchronous dynamic random access memory (also referred to as SDRAM) or a static random access memory (also referred to as SRAM).

The RAM 12 functions as a buffer for data transfer between the host device 2 and the NAND device 20. The RAM 12 provides a work area to the CPU 14. Firmware (also referred to as a program) stored in the ROM 13 is loaded into the RAM 12 when the memory device 1 operates.

The CPU 14 is an example of a hardware processor. The CPU 14 controls operations of the memory controller 10 by executing, for example, the firmware loaded into the RAM 12. For example, the CPU 14 controls operations relating to data writing, reading, and erasing to and from the NAND device 20.

The CPU 14 realizes a command sender CS by executing the firmware. The command sender CS is a functional unit that transmits commands (for example, a read command and a write command) to the NAND device 20. All or a part of the command sender CS may be realized by a circuit provided in the NAND controller 16.

The ECC circuit 15 performs encoding for error correction on data for writing into the NAND device 20. When an error is included in data read from the NAND device 20, the ECC circuit 15 performs error correction on the read data based on an error correction code assigned when the write operation is performed.

The NAND controller 16 performs control of data transfer between the RAM 22 and the NAND device 20 under the control of the CPU 14. In the present embodiment, the NAND controller 16 has a plurality of channels ch. Although FIG. 1 shows an example in which two channels ch (that is, ch. 0 and ch. 1) are provided, the memory controller 10 may have one or more than three channels ch. The NAND controller 16 includes a plurality of NAND Phys 30 corresponding to, for example, the number of channels ch.

Each NAND Phy 30 is a physical layer that is a part of a transmission/reception circuit of the NAND controller 16. The NAND Phy 30 converts a digital signal that is to be transmitted from the memory controller 10 to a NAND device 20 into an electrical signal. The NAND Phy 30 transmits the converted electrical signal to the NAND device 20 through a transmission line L. The NAND Phy 30 also receives an electrical signal transmitted from the NAND device 20 through the transmission line L. The NAND Phy 30 converts the received electrical signal into a digital signal. The NAND Phy 30 is an example of a "transmission device." The NAND Phy 30 will be described in detail later.

The NAND device 20 is a memory chip as a nonvolatile semiconductor memory and is, for example, a NAND flash memory. In the present embodiment, a plurality of NAND devices 20 (only two shown in FIG. 1) are connected to each channel ch (ch. 0 and ch. 1). The number of NAND devices 20 connected to each channel ch may be one or more than three. One NAND device 20A connected to, for example, the channel ch. 0 is an example of a "first semiconductor memory device." Another NAND device 20B connected to, for example, the channel ch. 0 is an example of a "second semiconductor memory device."

Here, the plurality of NAND Phys 30 have the same or similar configurations and the plurality of NAND devices 20 have the same or similar configurations. Therefore, hereinafter, one NAND Phy 30 and one NAND device 20 will be described.

<2. Configurations of NAND Phy and NAND Device>
<2.1 Configuration of NAND Phy>

Figure 2:
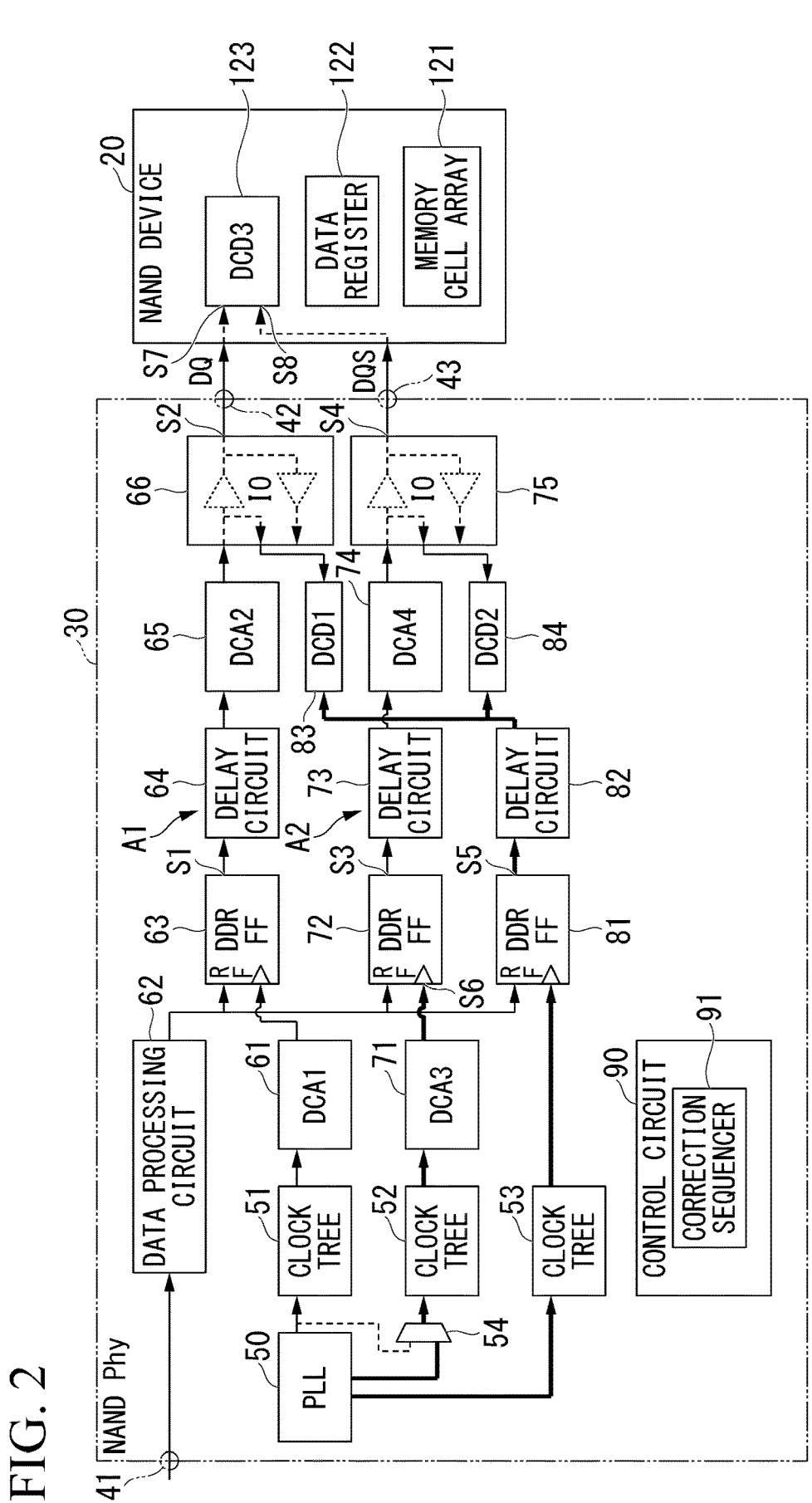
FIG. 2 is a block diagram showing configurations of a NAND Phy and a NAND device in the first embodiment.

FIG. 2 is a block diagram showing configurations of the NAND Phy 30 and the NAND device 20.

FIG. 2 shows an extracted part of a circuit relating to signal transmission in the NAND Phy 30. The NAND Phy 30 includes, for example, first to third connection terminals 41, 42, and 43, a phase locked loop (also referred to as PLL) circuit 50, first to third clock trees 51 to 53, a multiplexer 54, first to fourth duty adjustment circuits 61, 65, 71, and 74, a data processing circuit 62, first to third double data rate (DDR) flip-flop circuits 63, 72, and 81, first to third delay circuits 64, 73, and 82, first and second input/output circuits 66 and 75, first and second detection circuits 83 and 84, and a control circuit 90.

The first connection terminal 41 is an input terminal of the NAND Phy 30 and is connected to another component in the NAND controller 16. The second connection terminal 42 is connected to the NAND device 20 through one of the channels ch described above. The second connection terminal 42 functions as an output terminal for a data signal (DQ). The "data signal" is a signal indicating a content of data. The third connection terminal 43 is connected to the NAND device 20 through the same channel ch as that of the second connection terminal 42. That is, the second connection terminal 42 and the third connection terminal 43 are connected to one or a plurality of identical NAND devices 20. The third connection terminal 43 functions as an output terminal for an operation clock (also referred to as DQS). The "operation clock" is a signal used to adjust the timing of data writing to the NAND device 20 or the like. In the present embodiment, the second connection terminal 42 is an example of a "first terminal." The third connection terminal 43 is an example of a "second terminal."

The PLL (also referred to as phase locked loop) circuit 50 is a phase synchronization circuit and includes a clock oscillator. The PLL circuit 50 can output a plurality of types of clocks whose phases are synchronized, for example, by changing the frequency division ratio through frequency multiplication. In the present embodiment, the PLL circuit 50 can output a first clock having a first period (also referred to as a first frequency) and a second clock having a second period which is 1/m times the first period, that is, having a second period (also referred to as a second frequency) which is m times the first frequency (where m is a natural number of 2 or more).

The PLL circuit 50 is an example of a "clock supply circuit." In FIG. 2, a flow of the first clock is indicated by a thin line and a flow of the second clock is indicated by a thick line. The following description will be given with reference to an example in which the second clock is twice as fast as the first clock (i.e., has half the period of the first clock or twice the frequency of the first clock).

The first clock tree 51 is a circuit that distributes the first clock generated by the PLL circuit 50. The first clock tree 51 is supplied with the first clock from the PLL circuit 50 and outputs the supplied first clock to the first duty adjustment circuit 61.

The second clock tree 52 is a circuit that distributes the first clock or the second clock generated by the PLL circuit 50. An input terminal of the second clock tree 52 is connected to the PLL circuit 50 via the multiplexer 54. When the multiplexer 54 is in a first state, the second clock tree 52 is supplied with the first clock from the PLL circuit 50 and outputs the supplied first clock to the third duty adjustment circuit 71. On the other hand, when the multiplexer 54 is in a second state, the second clock tree 52 is supplied with the second clock from the PLL circuit 50 and outputs the supplied second clock to the third duty adjustment circuit 71. The multiplexer 54 is controlled by a correction sequencer 91 that will be described later and is switched between the first state and the second state. For example, when an operation of writing data into the NAND device 20 (hereinafter simply referred to as a "data write operation") or the like is performed, the multiplexer 54 is switched to the first state. On the other hand, when a third correction process that will be described later is performed, the multiplexer 54 is switched to the second state.

The third clock tree 53 is a circuit that distributes the second clock generated by the PLL circuit 50. The third clock tree 53 is supplied with the second clock from the PLL circuit 50 and outputs the supplied second clock to the third DDR flip-flop circuit 81.

The first duty adjustment circuit 61 (also referred to as a duty cycle adjuster (i.e. DCA) which will be hereinafter referred to as a "first DCA circuit 61") is a circuit that adjusts (or corrects) the duty of the first clock on the upstream side of the first DDR flip-flop circuit 63. The first DCA circuit 61 adjusts the duty of the first clock supplied from the first clock tree 51 and outputs the first clock with the adjusted duty to the first DDR flip-flop circuit 63.

Figure 3:
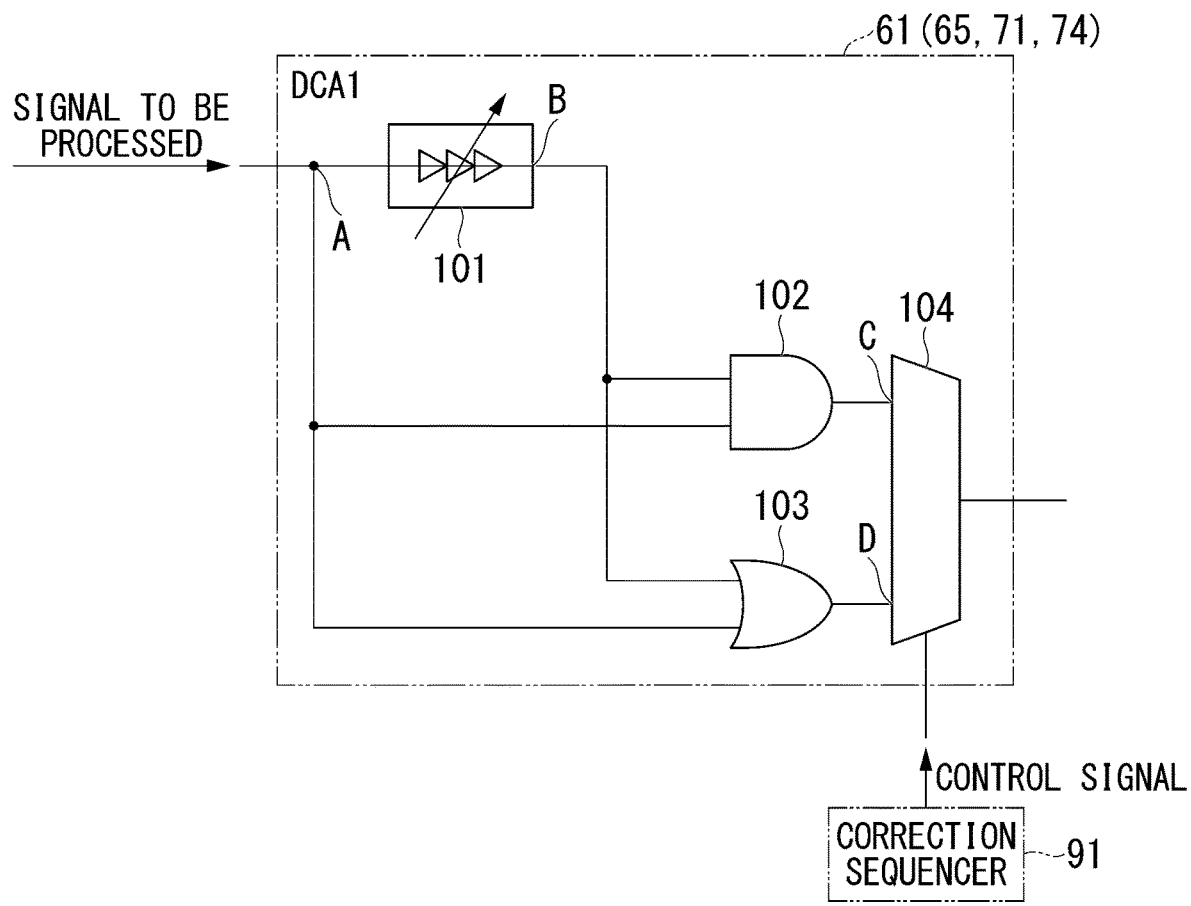
FIG. 3 is a block diagram showing an example of an internal configuration of a DCA circuit in the first embodiment.

FIG. 3 is a block diagram showing an example of an internal configuration of the first DCA circuit 61. The first DCA circuit 61 includes, for example, a delay circuit 101, an AND element 102, an OR element 103, and a multiplexer 104.

The delay circuit 101 delays the signal (also referred to as first clock) input to the first DCA circuit 61. For example, the delay circuit 101 includes a plurality of delay elements connected in series and can change the number of delay elements based on a signal from the outside (for example, a signal from the correction sequencer 91). The delay circuit 101 can adjust the amount of delay of the input signal by changing the number of delay elements.

The signal delayed by the delay circuit 101 is supplied to a first input terminal of the AND element 102. The signal input to the first DCA circuit 61 is directly supplied to a second input terminal of the AND element 102. Similarly, the signal delayed by the delay circuit 101 is supplied to a first input terminal of the OR element 103. The signal input to the first DCA circuit 61 is directly supplied to a second input terminal of the OR element 103.

A first input terminal of the multiplexer 104 is connected to an output terminal of the AND element 102. A second input terminal of the multiplexer 104 is connected to an output terminal of the OR element 103. The output terminal of the multiplexer 104 is an output terminal of the first DCA circuit 61. The multiplexer 104 can be switched between a first state in which it connects the output terminal of the AND element 102 to the output terminal of the multiplexer 104 and a second state in which it connects the output terminal of the OR element 103 to the output terminal of the multiplexer 104 based on a signal from the outside (for example, a signal from the correction sequencer 91).

Figure 4:
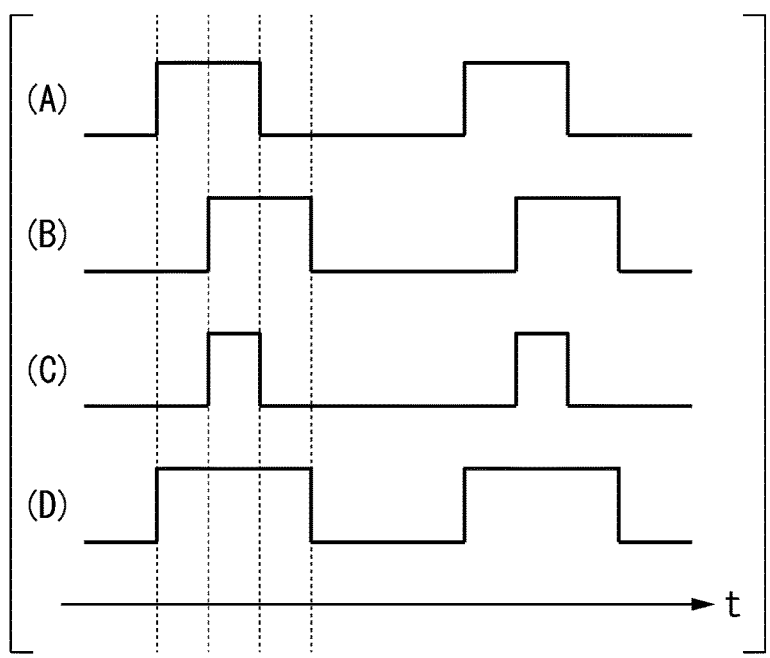
FIG. 4 is a timing chart showing signals at points of the DCA circuit in the first embodiment.

FIG. 4 is a timing chart showing signals at points in the first DCA circuit 61.

Part (A) of FIG. 4 shows a waveform of the signal (also referred to as the first clock) (that is, the signal at point A in FIG. 3) input to the first DCA circuit 61. Part (B) of FIG. 4 shows a waveform of the signal delayed by the delay circuit 101 (that is, the signal at point B in FIG. 3). Part (C) of FIG. 4 shows a waveform of the signal input to the first input terminal of the multiplexer 104 (that is, the signal at point C in FIG. 3). Part (D) of FIG. 4 shows a waveform of the signal input to the second input terminal of the multiplexer 104 (that is, the signal at point D in FIG. 3).

As shown in FIG. 4, the correction sequencer 91 can change the duty of the signal passing through the first DCA circuit 61 based on the amount of delay of the signal due to the delay circuit 101 and the state of the multiplexer 104. For example, the correction sequencer 91 makes the duty of the signal smaller than that of the original signal (i.e. decreases the duty ratio of the signal) by setting the multiplexer 104 to the first state. The correction sequencer 91 makes the duty of the signal larger than that of the original signal (i.e. increases the duty ratio of the signal) by setting the multiplexer 104 to the second state.

The configurations of the second to fourth duty adjustment circuits 65, 71, and 74 are similar to, for example, that of the first DCA circuit 61 described above. For description of the second to fourth duty adjustment circuits 65, 71, and 74, the "first clock" may be replaced with a "data signal" or a "toggle signal" and the "second clock" may be replaced with an "operation clock" or a "sampling clock" in the above description. The configurations of the first to fourth duty adjustment circuits 61, 65, 71, and 74 are not limited to the above example.

As shown in FIG. 2, the data processing circuit 62 is connected to another circuit in the NAND controller 16 through the first connection terminal 41 of the NAND Phy 30. When a data write operation is performed, data for writing that is to be transmitted to the NAND device 20 is input to the data processing circuit 62. The data processing circuit 62 outputs the input data for writing to the first DDR flip-flop circuit 63. When the data write operation is performed, the data processing circuit 62 also acquires data indicating an operation clock pattern that is to be transmitted to the NAND device 20 from a storage (not shown). The data processing circuit 62 outputs the data indicating the operation clock pattern to the second DDR flip-flop circuit 72.

When a first correction process is performed, the data processing circuit 62 acquires data indicating a toggle pattern (i.e. a pattern in which a high level and a low level are alternately repeated with a certain period) that is to be output to the first detection circuit 83 from the storage (not shown). The data processing circuit 62 outputs the data indicating the toggle pattern to the first DDR flip-flop circuit 63. When the first correction process is performed, the data processing circuit 62 also acquires data indicating a sampling clock pattern that is to be output to the first detection circuit 83 from the storage (not shown). The data processing circuit 62 outputs the data indicating the sampling clock pattern to the third DDR flip-flop circuit 81. When a second correction process is performed, the "first DDR flip-flop circuit 63" may be replaced with the "second DDR flip-flop circuit 72" in the above description.

In the present embodiment, when a third correction process is performed, the data processing circuit 62 acquires data indicating a toggle pattern that is to be transmitted to the NAND device 20 from the storage (not shown). The data processing circuit 62 outputs the data indicating the toggle pattern to the first DDR flip-flop circuit 63. When the third correction process is performed, the data processing circuit 62 also acquires data indicating a special sampling clock pattern that is to be transmitted to the NAND device 20 from the storage (not shown). The data processing circuit 62 outputs the data indicating the special sampling clock pattern to the second DDR flip-flop circuit 72. These will be described in detail later.

A signal input terminal of the first DDR (i.e. Double Data Rate) flip-flop circuit 63 (hereinafter referred to as a "first DDR_FF circuit 63") is connected to an output terminal of the data processing circuit 62. A clock input terminal of the first DDR_FF circuit 63 is connected to the output terminal of the first DCA circuit 61. When a data write operation is performed, the first DDR_FF circuit 63 generates a data signal having a predetermined transfer rate (i.e. a signal indicating the content of the data for writing) using the data supplied from the data processing circuit 62 and the first clock supplied from the first DCA circuit 61. The data write operation is an example of a "first operation." The data signal is an example of a "first signal."

When the third correction process is performed, the first DDR_FF circuit 63 generates a signal having a toggle pattern based on the first clock (hereinafter referred to as a "toggle signal"). For example, when the third correction process is performed, the first DDR_FF circuit 63 generates a toggle signal using the data indicating the toggle pattern supplied from the data processing circuit 62 and the first clock supplied from the first DCA circuit 61. This will be described in detail later. The third correction process is an example of a "second operation." The toggle signal is an example of a "second signal."

Figure 5:
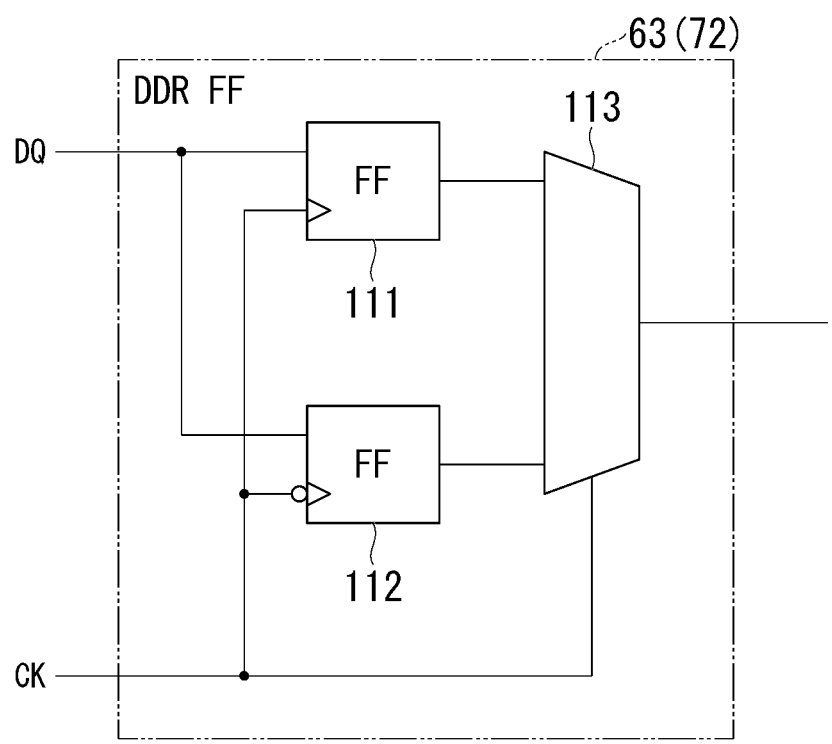
FIG. 5 is a block diagram showing an example of an internal configuration of a first DDR flip-flop circuit in the first embodiment.

FIG. 5 is a block diagram showing an example of an internal configuration of the first DDR_FF circuit 63. The first DDR_FF circuit 63 includes, for example, a first flip-flop circuit 111 (hereinafter referred to as a "first FF circuit 111"), a second flip-flop circuit 112 (hereinafter referred to as a "second FF circuit 112"), and a multiplexer 113.

A signal input terminal of the first FF circuit 111 is connected to the output terminal of the data processing circuit 62. A clock input terminal of the first FF circuit 111 is connected to the output terminal of the first DCA circuit 61. A signal input terminal of the second FF circuit 112 is connected to the output terminal of the data processing circuit 62. A clock input terminal of the second FF circuit 112 is connected to the output terminal of the first DCA circuit 61, for example, through a logic inversion circuit.

A first input terminal of the multiplexer 113 is connected to an output terminal of the first FF circuit 111. A second input terminal of the multiplexer 113 is connected to an output terminal of the second FF circuit 112. A control terminal of the multiplexer 113 is connected to the output terminal of the first DCA circuit 61. An output terminal of the multiplexer 113 is an output terminal of the first DDR_FF circuit 63. The multiplexer 113 can be switched between a first state in which it connects the output terminal of the first FF circuit 111 to the output terminal of the multiplexer 113 and a second state in which it connects the output terminal of the second FF circuit 112 to the output terminal of the multiplexer 113 based on the first clock from the first DCA circuit 61 that has been input to the control terminal.

That is, the first DDR_FF circuit 63 updates a value output from the output terminal of the data processing circuit 62 at each rising and falling edge of each cycle of the first clock. As a result, the first DDR_FF circuit 63 generates a data signal at a timing with a frequency that is twice that of the first clock and outputs the generated data signal to the first delay circuit 64.

The configurations of the second and third DDR flip-flop circuits 72 and 81 are similar to, for example, that of the first DDR_FF circuit 63 described above. The operations of the second and third DDR flip-flop circuits 72 and 81 will be described later. The configurations of the first to third DDR flip-flop circuits 63, 72, and 81 are not limited to the above example.

As shown in FIG. 2, the first delay circuit 64 is supplied with a data signal from the first DDR_FF circuit 63. The first delay circuit 64 delays the data signal passing through the first delay circuit 64. For example, the first delay circuit 64 includes a plurality of delay elements connected in series and can change the number of delay elements based on a signal from the outside (for example, a signal from the correction sequencer 91). The first delay circuit 64 adjusts the amount of delay (or phase) of the data signal by changing the number of delay elements. As described above, the "phase" corresponds to the timing of rising (or falling) of an edge of a pulse-like signal. For this reason, "phase" may be replaced with "timing" in the present embodiment. The first delay circuit 64 outputs the data signal with the adjusted amount of delay.

The data signal with the adjusted amount of delay is supplied from the first delay circuit 64 to the second duty adjustment circuit 65 (hereinafter referred to as a "second DCA circuit 65"). The second DCA circuit 65 is a circuit that adjusts (or corrects) the duty of the data signal on the downstream side of the first DDR_FF circuit 63. The second DCA circuit 65 outputs the data signal with the adjusted duty to the first input/output circuit 66. The second DCA circuit 65 has a configuration similar to that of the first DCA circuit 61.

A first terminal of the first input/output circuit 66 is connected to an output terminal of the second DCA circuit 65.

A second terminal of the first input/output circuit 66 is connected to the NAND device 20 via the second connection terminal 42 that is an external connection terminal of the NAND Phy 30. A third terminal of the first input/output circuit 66 is connected to the first detection circuit 83. The first input/output circuit 66 outputs the data signal supplied from the second DCA circuit 65 to the NAND device 20 via the second connection terminal 42 and also outputs it to the first detection circuit 83.

As described above, the first DCA circuit 61, the first DDR_FF circuit 63, the first delay circuit 64, the second DCA circuit 65, and the first input/output circuit 66 cooperate to constitute an example of the "first output circuit A1." In the first output circuit A1, one of the first DCA circuit 61 and the second DCA circuit 65 may be omitted.

The third duty adjustment circuit 71 (hereinafter referred to as a "third DCA circuit 71") is a circuit that adjusts (or corrects) the duty of the clock on the upstream side of the second DDR flip-flop circuit 72. The third DCA circuit 71 adjusts the duty of the first clock or the second clock supplied from the second clock tree 52 and outputs the first clock or the second clock with the adjusted duty to the second DDR flip-flop circuit 72. The third DCA circuit 71 is an example of a "second adjustment circuit" that can adjust the duty of a special sampling clock that will be described later. The third DCA circuit 71 has a configuration similar to that of the first DCA circuit 61.

A signal input terminal of the second DDR flip-flop circuit 72 (hereinafter referred to as a "second DDR_FF circuit 72") is connected to the output terminal of the data processing circuit 62. A clock input terminal of the second DDR_FF circuit 72 is connected to the output terminal of the third DCA circuit 71. When a data write operation is performed, the second DDR_FF circuit 72 generates an operation clock based on the first clock. For example, when a data write operation is performed, the second DDR_FF circuit 72 generates an operation clock synchronized with the first clock using data indicating the operation clock supplied from the data processing circuit 62 and the first clock supplied from the third DCA circuit 71.

When the third correction process is performed, the second DDR_FF circuit 72 generates a special sampling clock based on the second clock. For example, when the third correction process is performed, the second DDR_FF circuit 72 generates a special sampling clock synchronized with the second clock using data indicating the pattern of the special sampling clock supplied from the data processing circuit 62 and the second clock supplied from the third DCA circuit 71. This will be described in detail later. Hereinafter, the "operation clock" and the "sampling clock" may be collectively referred to as a "clock."

The configuration of the second DDR_FF circuit 72 is similar to, for example, that of the first DDR_FF circuit 63. For description of the second DDR_FF circuit 72, the "first DCA circuit 61" may be replaced with the "third DCA circuit 71" and the "first clock input to the control terminal" may be replaced with the "second clock input to the control terminal" in the above description of the first DDR_FF circuit 63.

Inputting the second clock to the control terminal allows the second DDR_FF circuit 72 to output edges at intervals of 0.5 cycle of the first period.

The clock is input from the second DDR_FF circuit 72 to the second delay circuit 73. The second delay circuit 73 delays the clock passing through the second delay circuit 73. For example, the second delay circuit 73 includes a plurality of delay elements connected in series and can change the number of delay elements based on a signal from the outside (for example, a signal from the correction sequencer 91). The second delay circuit 73 adjusts the amount of delay (or phase) of the clock by changing the number of delay elements. The second delay circuit 73 outputs the clock with the adjusted amount of delay. The second delay circuit 73 is an example of a "first adjustment circuit" that can adjust the phase of the special sampling clock that will be described later.

The clock with the adjusted amount of delay is supplied from the second delay circuit 73 to the fourth duty adjustment circuit 74 (hereinafter referred to as a "fourth DCA circuit 74"). The fourth DCA circuit 74 is a circuit that adjusts (or corrects) the duty of the clock on the downstream side of the second DDR_FF circuit 72. The fourth DCA circuit 74 outputs the clock with the adjusted duty to the second input/output circuit 75. The fourth DCA circuit 74 is another example of the "second adjustment circuit" that can adjust the duty of the special sampling clock that will be described later. The fourth DCA circuit 74 has a configuration similar to that of the first DCA circuit 61.

A first terminal of the second input/output circuit 75 is connected to an output terminal of the fourth DCA circuit 74.

A second terminal of the second input/output circuit 75 is connected to the NAND device 20 via the third connection terminal 43 that is an external connection terminal of the NAND Phy 30. A third terminal of the second input/output circuit 75 is connected to the second detection circuit 84. The second input/output circuit 75 outputs the clock supplied from the fourth DCA circuit 74 to the NAND device 20 via the third connection terminal 43 and also outputs it to the second detection circuit 84.

The third DCA circuit 71, the second DDR_FF circuit 72, the second delay circuit 73, the fourth DCA circuit 74, and the second input/output circuit 75 described above cooperate to constitute an example of the "second output circuit A2." In the second output circuit A2, one of the third DCA circuit 71 and the fourth DCA circuit 74 may be omitted. In the present embodiment, the PLL circuit 50, the first output circuit A1, and the second output circuit A2 constitute an example of the "semiconductor integrated circuit."

A signal input terminal of the third DDR flip-flop circuit 81 (hereinafter referred to as a "third DDR_FF circuit 81") is connected to the output terminal of the data processing circuit 62. A clock input terminal of the third DDR_FF circuit 81 is connected to the output terminal of the clock tree 53. When the first and second correction processes are performed, the third DDR_FF circuit 81 generates a sampling clock. For example, when the first and second correction processes are performed, the third DDR_FF circuit 81 generates a sampling clock synchronized with the second clock using data indicating the sampling clock supplied from the data processing circuit 62 and the second clock supplied from the clock tree 53. The third DDR_FF circuit 81 outputs the generated sampling clock to the third delay circuit 82.

The configuration of the third DDR_FF circuit 81 is similar to, for example, that of the first DDR_FF circuit 63. For description of the third DDR_FF circuit 81, the "first DCA circuit 61" is replaced with the "clock tree 53" and the "first clock input to the control terminal" is replaced with the "second clock input to the control terminal" in the above description of the first DDR_FF circuit 63.

Inputting the second clock to the control terminal allows the third DDR_FF circuit 81 to output edges at intervals of 0.5 cycle of the first period.

The sampling clock is input from the third DDR_FF circuit 81 to the third delay circuit 82. The third delay circuit 82 delays the input sampling clock. For example, the third delay circuit 82 includes a plurality of delay elements connected in series and can change the number of delay elements based on a signal from the outside (for example, a signal from the correction sequencer 91). The third delay circuit 82 adjusts the amount of delay (or phase) of the sampling clock by changing the number of delay elements. The third delay circuit 82 outputs the sampling clock with the adjusted amount of delay to the first detection circuit 83 and the second detection circuit 84.

The first detection circuit 83 (also referred to as duty cycle detector (i.e. DCD)) detects the suitability of the duty and phase of the data signal transmitted to the NAND device 20 based on the signal supplied from the first input/output circuit 66 and the sampling clock supplied from the third delay circuit 82. The detection result (i.e. sampling result) of the first detection circuit 83 is output to the correction sequencer 91. The detection operation of the first detection circuit 83 will be described in detail later.

The second detection circuit 84 detects the suitability of the duty and phase of the operation clock transmitted to the NAND device 20 based on the operation clock supplied from the second input/output circuit 75 and the sampling clock supplied from the third delay circuit 82. The detection result (i.e. sampling result) of the second detection circuit 84 is output to the correction sequencer 91. The detection operation of the second detection circuit 84 will be described in detail later.

The control circuit 90 performs overall control of the operation of the NAND Phy 30. The control circuit 90 includes the correction sequencer 91 that performs the first to third correction processes that will be described later. The correction sequencer 91 is a circuit provided in the NAND Phy 30. The correction sequencer 91 performs the first to third correction processes by controlling the components of the NAND Phy 30 (for example, the multiplexer 54, the first to fourth duty adjustment circuits 61, 65, 71, and 74, the data processing circuit 62, and the first to third delay circuits 64, 73, and 82). In the present embodiment, "correction" means to derive a correction value for preliminarily adjusting the duty and/or phase of the data signal in the NAND Phy 30 (for example, a correction value relating to the data signal in the first output circuit A1 or a correction value relating to the operation clock in the second output circuit A2) and to reflect the correction value in the duty adjustment circuits 61, 65, 71, and 74 and/or the delay circuits 64, 73, and 82 such that the data signal that has reached the inside of the NAND device 20 becomes a data signal suitable for processing. This correction process will be described in detail later.

<2.2 Configuration of NAND Device>

Next, the NAND device 20 will be described.

As shown in FIG. 2, the NAND device 20 includes, for example, a memory cell array 121, a data register 122, and a third detection circuit 123.

The memory cell array 121 includes a plurality of memory cell transistors and stores data in a nonvolatile manner. A peripheral circuit (not shown) is connected to the memory cell array 121. When a data write operation and a data read operation are performed on the memory cell array 121, the peripheral circuit applies a predetermined voltage to various wirings of the memory cell array.

The data register 122 is a data buffer that temporarily stores data when a data write or read operation is performed on the memory cell array 121. For example, when data of a predetermined unit (for example, one page) is written into the memory cell array 121, the data register 122 collects data sequentially transmitted from the memory controller 10 until the data sequentially transmitted from the memory controller 10 is accumulated up to the predetermined unit and collectively written into the memory cell array 121.

When the third correction process is performed, the third detection circuit 123 detects the suitability of the duty and phase of the toggle signal in the NAND device 20 based on the toggle signal transmitted from the NAND Phy 30 and the sampling clock transmitted from the NAND Phy 30. The detection result (i.e. sampling result) of the third detection circuit 123 is stored in the data register 122. The detection operation of the third detection circuit 123 will be described in detail later.

<3. Correction Processes>

Next, correction processes performed by the NAND Phy 30 will be described. The correction processes described below are performed under the control of the correction sequencer 91 unless otherwise described. The correction processes performed in the present embodiment include the first and second correction processes based on results of detection in the NAND Phy 30 (i.e. the detection results of the first and second detection circuits 83 and 84) and the third correction process based on a result of detection in the NAND device 20 (the detection result of the third detection circuit 123). These correction processes are performed when a predetermined condition is satisfied (for example, when power is initially supplied to the memory device 1). Note that the first and second correction processes are not essential and may be omitted.

<3.1 Correction Process Based on Result of Detection in NAND Phy>

<3.1.1 Correction Process Based on Detection Result of First Detection Circuit>

The correction sequencer 91 performs a first correction process for correcting the duty and phase of the data signal based on the detection result of the first detection circuit 83 when a predetermined condition for performing the correction process is satisfied.

Figure 6:
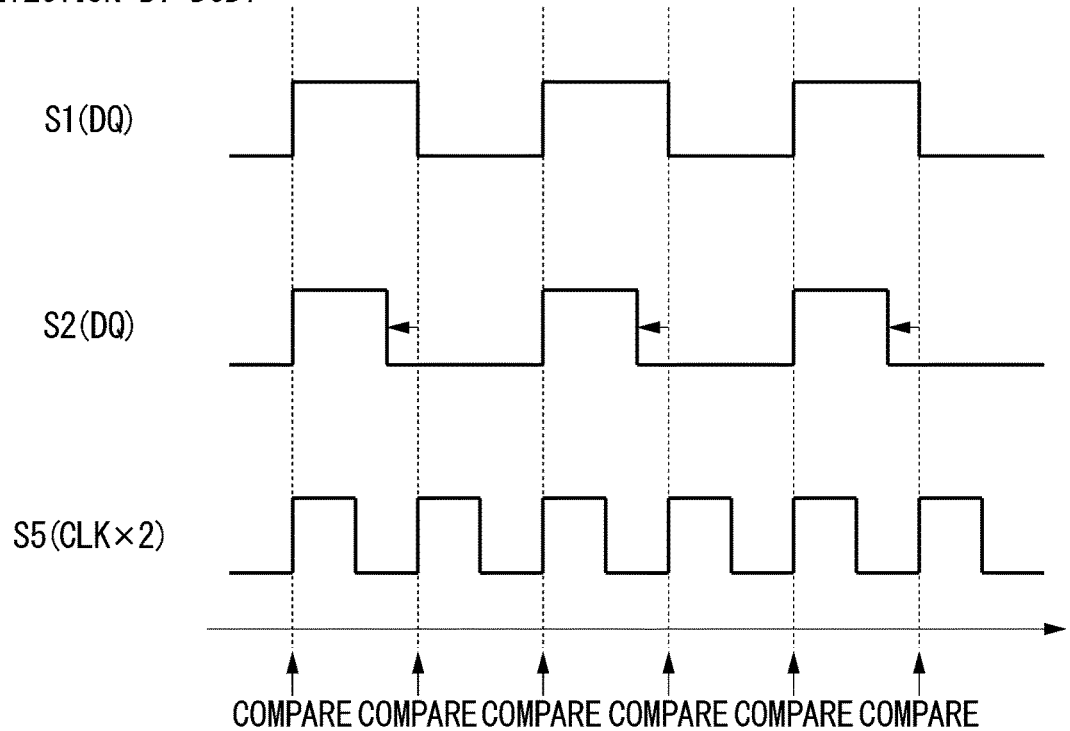
FIG. 6 is a timing chart illustrating a first correction process in the first embodiment.

FIG. 6 is a timing chart illustrating the first correction process. S1, S2, and S5 in FIG. 6 indicate signals at points S1, S2, and S5 in FIG. 2, respectively. In the first correction process, a first clock is output from the first clock tree 51, data indicating a toggle pattern is output from the data processing circuit 62, and the first DDR_FF circuit 63 generates a toggle signal using the first clock. The toggle signal generated by the first DDR_FF circuit 63 passes through the first delay circuit 64 and the second DCA circuit 65 and is input from the first input/output circuit 66 to the first detection circuit 83.

On the other hand, in the first correction process, a second clock output from the third clock tree 53 passes through the third DDR_FF circuit 81 and the third delay circuit 82 and is input to the first detection circuit 83 as a sampling clock that is twice as fast as the toggle signal.

Then, the first detection circuit 83 detects (or samples), for example, the presence or absence of a rising edge and a falling edge of the toggle signal at the timings of rising edges of the sampling clock. Specifically, the first detection circuit 83 includes a comparator that compares the output (or level) of the sampling clock with the output (or level) of the toggle signal. The first detection circuit 83 detects the presence or absence of a rising edge and a falling edge of the toggle signal at the timings of rising edges of the sampling clock based on the output result of the comparator.

More specifically, the first detection circuit 83 determines that rising edges (or falling edges) of the toggle signal have shifted (or deviated) from rising edges of the sampling clock when a high level (or low level) of the toggle signal has been stably detected at the timings of rising edges in a plurality of cycles of the sampling clock. On the other hand, the first detection circuit 83 determines that rising edges of the sampling clock match rising edges (or falling edges) of the toggle signal when a high level (or low level) of the toggle signal has not been stably detected at the timings of rising edges in a plurality of cycles of the sampling clock.

In the example shown in FIG. 6, the data signal transmitted to the NAND device 20 (see S2 in FIG. 6) has deteriorated with a reduced duty, compared to the data signal immediately after it is output from the first DDR_FF circuit 63 (see S1 in FIG. 6). For this reason, the rising edges of the sampling clock do not match the falling edges of the data signal in the first detection circuit 83. In this case, by performing detection through the first detection circuit 83, it is possible to detect that falling edges of the toggle signal have deviated from rising edges of the sampling clock.

When rising edges of the toggle signal have deviated from rising edges of the sampling clock, the correction sequencer 91 corrects the phase of the toggle signal by changing the set value of the amount of delay of the first delay circuit 64. Similarly, when the rising edges of the toggle signal match the rising edges of the sampling clock but the falling edges of the toggle signal have deviated from the rising edges of the sampling clock, the correction sequencer 91 corrects the duty of the toggle signal by changing the amount of duty adjustment of at least one of the first DCA circuit 61 and the second DCA circuit 65. Thereby, the correction process relating to the data signal is performed.

<3.1.2 Correction Process Based on Detection Result of Second Detection Circuit>

The correction sequencer 91 performs a second correction process for correcting the duty and phase of the operation clock based on the detection result of the second detection circuit 84 when a predetermined condition for performing the correction process is satisfied.

Figure 7:
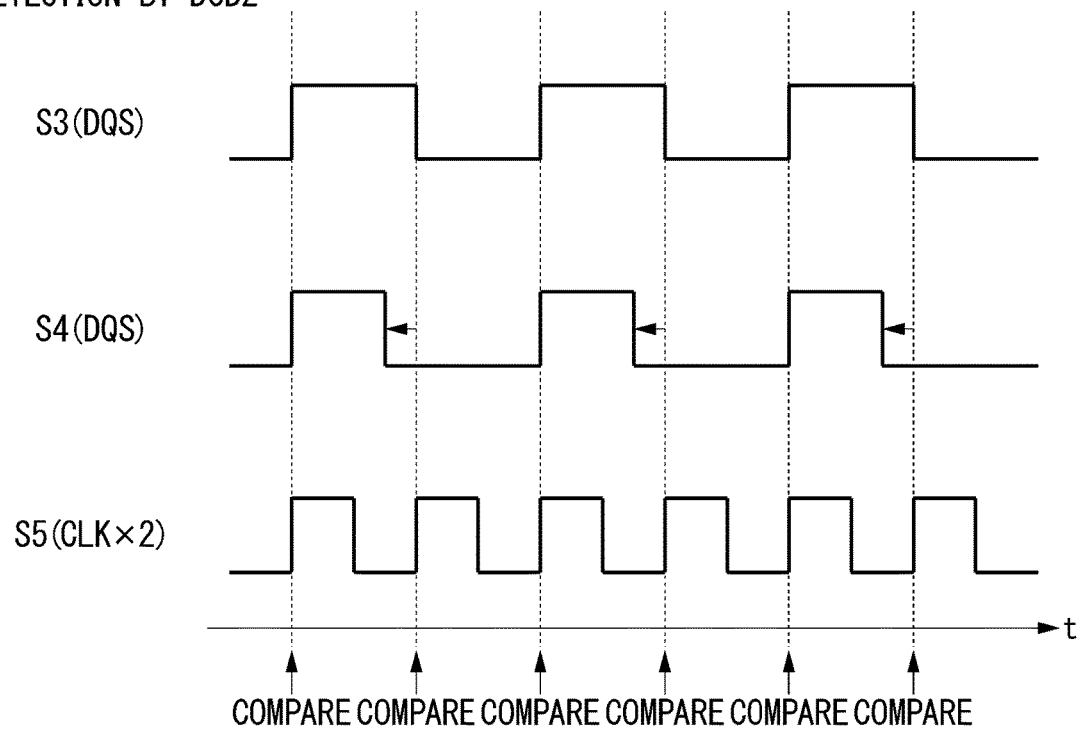
FIG. 7 is a timing chart illustrating a second correction process in the first embodiment.

FIG. 7 is a timing chart illustrating the second correction process. S3, S4, and S5 in FIG. 7 indicate signals at points S3, S4, and S5 in FIG. 2, respectively. In the second correction process, the multiplexer 54 is controlled to the first state, a first clock is output from the first clock tree 52, data indicating a toggle pattern is output from the data processing circuit 62, and the second DDR_FF circuit 72 generates an operation clock having the same period as the first clock and synchronized with the toggle pattern. The operation clock generated by the second DDR_FF circuit 72 passes through the second delay circuit 73 and the fourth DCA circuit 74 and is input from the second input/output circuit 75 to the second detection circuit 84.

On the other hand, in the second correction process, the second clock output from the third clock tree 53 passes through the third DDR_FF circuit 81 and the third delay circuit 82 and is input to the second detection circuit 84 as a sampling clock that is twice as fast as the operation clock. Then, the second detection circuit 84 detects (or samples), for example, the presence or absence of a rising edge and a falling edge of the operation clock at the timings of rising edges of the sampling clock.

Details of the second correction process are similar to those of the first correction process described above. For description of the second correction process, the "data signal" may be replaced with the "operation clock," the "first detection circuit 83" may be replaced with the "second detection circuit 84," the "first DDR_FF circuit 63" may be replaced with the "second DDR_FF circuit 72," the "first delay circuit 64" may be replaced with the "second delay circuit 73," the "first DCA circuit 61" may be replaced with the "third DCA circuit 71," and the "second DCA circuit 65" may be replaced with the "fourth DCA circuit 74" in the above description of the first correction process.

<3.2 Correction Process Based on Result of Detection in NAND Device>

Next, the third correction process based on a result of detection in the NAND device 20 will be described. The correction sequencer 91 performs a third correction process for correcting the duty and phase of the data signal based on the detection result of the third detection circuit 123 when a predetermined condition for performing the third correction process is satisfied.

<3.2.1 Overall Operation of Third Correction Process>

First, the overall operation of the third correction process will be described.

Figure 8:
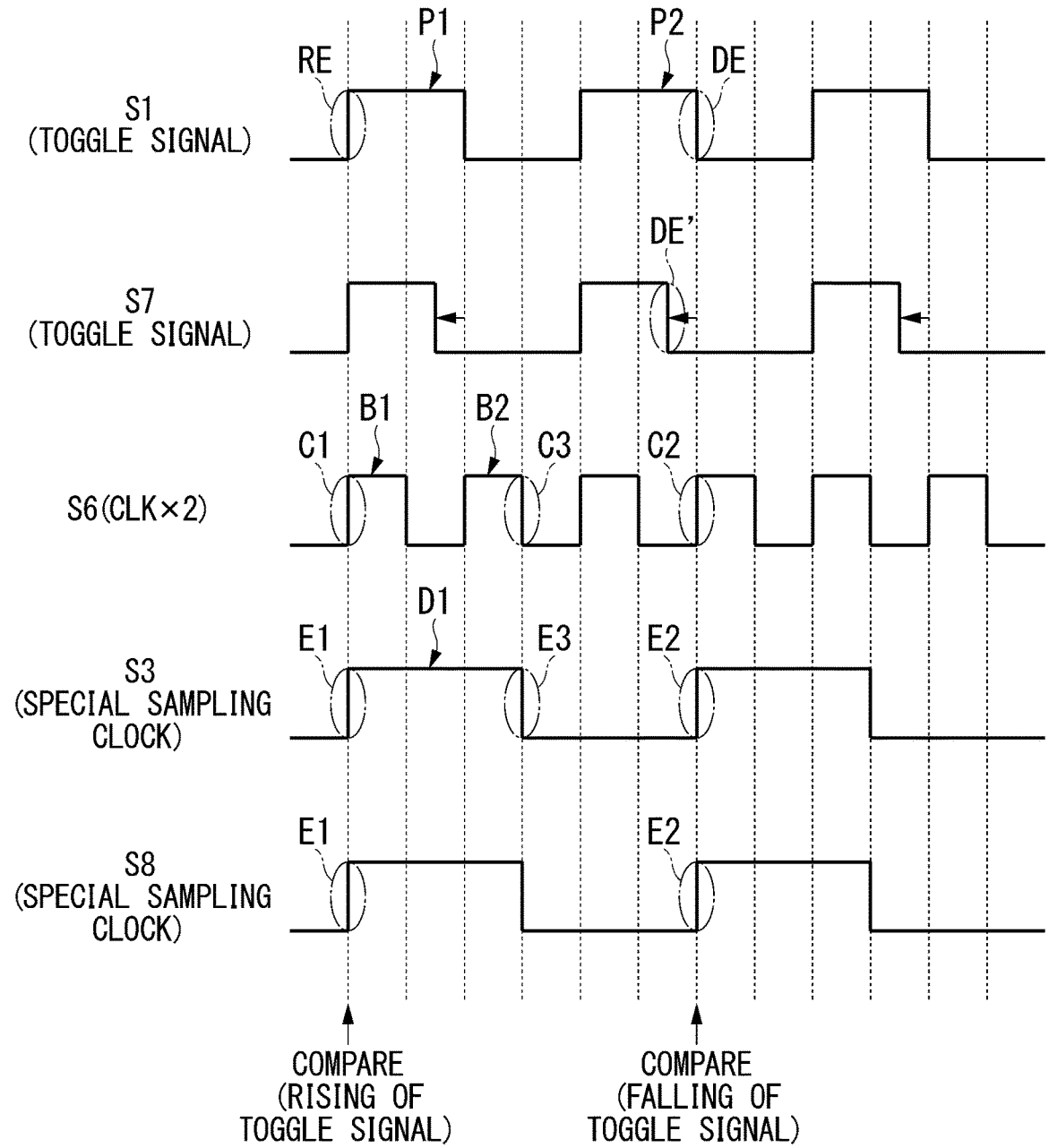
FIG. 8 is a timing chart illustrating a third correction process in the first embodiment.

FIG. 8 is a timing chart illustrating the third correction process. S1, S7, S6, S3, and S8 in FIG. 8 indicate signals at points S1, S7, S6, S3, and S8 in FIG. 2, respectively. In the third correction process, a first clock is output from the first clock tree 51, data indicating a toggle pattern is output from the data processing circuit 62, and the first DDR_FF circuit 63 generates a toggle signal using the first clock. The toggle signal generated by the first DDR_FF circuit 63 passes through the first delay circuit 64 and the second DCA circuit 65 and is input from the first input/output circuit 66 to the third detection circuit 123 of the NAND device 20.

On the other hand, in the third correction process, the multiplexer 54 is controlled to the second state and a second clock is supplied from the second clock tree 52 to the second DDR_FF circuit 72. The second DDR_FF circuit 72 generates a special sampling clock (i.e. a sampling clock having a special pattern) using the second clock based on data indicating the pattern of the special sampling clock supplied from the data processing circuit 62. Here, without limiting the invention, the term "special" is used for the sake of convenience to distinguish from the sampling clock used in the first and second correction processes described above. The special sampling clock generated by the second DDR_FF circuit 72 passes through the second delay circuit 73 and the fourth DCA circuit 74 and is input from the second input/output circuit 75 to the third detection circuit 123 of the NAND device 20.

In the present embodiment, when the third correction process is performed, the correction sequencer 91 issues a command instructing that the detection result of the third detection circuit 123 be written into the data register 122 in the NAND device 20. Specifically, the correction sequencer 91 outputs a predetermined control command to the command sender CS (see FIG. 1) to cause the command sender CS to transmit a write command, which is to write the detection result of the third detection circuit 123 to the data register 122 and designates an address in the data register 122 in the NAND device 20 as a write destination address, to the NAND device 20. Alternatively, the NAND device 20 may be preset such that the detection result of the third detection circuit 123 is automatically written to a specific address of the data register 122 when the third correction process is performed.

<3.2.2 Special Sampling Clock>

Next, the special sampling clock used in the third correction process will be described.

S3 and S8 in FIG. 8 show an example of the special sampling clock. The special sampling clock includes a first edge E1 for sampling one rising edge RE included in the toggle signal and a second edge E2 for sampling one falling edge DE included in the toggle signal. The second DDR_FF circuit 72 generates the first edge E1 and the second edge E2 using rising edges (for example, rising edges C1 and C2) of the second clock.

In the present embodiment, the rising edge RE is a rising edge of a first pulse P1 included in the toggle signal. The falling edge DE is a falling edge of a second pulse P2 different from the first pulse P1 (for example, a pulse immediately subsequent to the first pulse P1) included in the toggle signal. Then, the second DDR_FF circuit 72 generates the first edge E1 and the second edge E2 for sampling the rising edge RE and the falling edge DE using rising edges of the second clock.

For example, the special sampling clock includes a plurality of pulses generated by (n+0.5) frequency division of the first period described above (where n is a natural number of 1 or more). In the present embodiment, the second DDR_FF circuit 72 includes generates one pulse D1 of the special sampling clock based on a rising edge C1 of a first pulse B1 included in the second clock and a falling edge C3 of a second pulse B2 different from the first pulse B1 (for example, a pulse immediately subsequent to the first pulse B1) included in the second clock. That is, the second DDR_FF circuit 72 generates a rising edge E1 of the pulse D1 of the special sampling clock based on the rising edge C1 of the first pulse B1 and generates a falling edge E3 of the pulse D1 of the special sampling clock based on the falling edge C3 of the second pulse B2.

In the present embodiment, the correction sequencer 91 also controls the second delay circuit 73 to generate a special sampling clock whose phase gradually deviates. The special sampling clock whose phase gradually deviates is, for example, a sampling clock whose timing of the rising edge is gradually delayed (i.e. the rising edge interval gradually increases). Then, the second input/output circuit 75 outputs the special sampling clock whose phase gradually deviates to the third detection circuit 123 of the NAND device 20.

In the present embodiment, a special sampling clock whose phase gradually deviates in a plurality of cycles is continuously output in accordance with one write command to store the detection result of the third detection circuit 123 in the data register 122. That is, based on one write command, detection of the third detection circuit 123 is continuously performed using a special sampling clock whose phase gradually deviates in a plurality of cycles. Thereby, the amount of phase deviation of the toggle signal can be obtained.

In the present embodiment, the correction sequencer 91 also generates a special sampling clock whose duty gradually changes by controlling at least one of the third DCA circuit 71 and the fourth DCA circuit 74. The special sampling clock whose duty gradually changes is, for example, a special sampling clock whose duty ratio gradually increases (or gradually decreases). Then, the second input/output circuit 75 outputs the special sampling clock whose duty gradually changes to the third detection circuit 123 of the NAND device 20.

In the present embodiment, a special sampling clock whose duty gradually changes in a plurality of cycles is continuously output in accordance with one write command to store the detection result of the third detection circuit 123 in the data register 122. That is, based on one write command, detection of the third detection circuit 123 is continuously performed using a special sampling clock whose duty gradually changes in a plurality of cycles. Thereby, the amount of duty deviation of the toggle signal can be obtained.

<3.2.3 Detection Operation of Third Detection Circuit>

Next, the detection operation of the third detection circuit 123 will be described.

As shown in FIG. 8, the third detection circuit 123 detects (or samples), for example, the presence or absence of a rising edge and a falling edge of the toggle signal at the timing of rising edges of the special sampling clock. For example, the third detection circuit 123 detects the presence or absence of a rising edge RE and a falling edge DE of the toggle signal at the timing of rising edges E1 and E2 of the special sampling clock.

Specifically, the third detection circuit 123 includes a comparator that compares the output (or level) of the special sampling clock with the output (or level) of the toggle signal. The third detection circuit 123 detects the presence or absence of a rising edge and a falling edge of the toggle signal at the timing of rising edges of the special sampling clock based on the output result of the comparator. Details of this detection method are similar to those of the detection method of the first detection circuit 83.

In the example shown in FIG. 8, the toggle signal input to the inside of the NAND device 20 (see S7 in FIG. 8) has deteriorated with a reduced duty, compared to the data signal immediately after it is output from the first DDR_FF circuit 63 (see S1 in FIG. 8). For this reason, a falling edge DE' of the toggle signal does not match a rising edge E2 of the special sampling clock in the third detection circuit 123. In this case, by performing detection through the third detection circuit 123, it is possible to detect that falling edges of the toggle signal have shifted from rising edges of the sampling clock.

In the present embodiment, the third detection circuit 123 continues the detection operation while the special sampling clock whose phase gradually deviates is continuously transmitted from the NAND Phy 30 to the NAND device 20. The third detection circuit 123 also continues the detection operation while the special sampling clock whose duty gradually changes is continuously transmitted from the NAND Phy 30 to the NAND device 20.

For example, the third detection circuit 123 detects the presence or absence of a rising edge and a falling edge of the toggle signal at each rising edge of the special sampling clock.

In the present embodiment, the correction sequencer 91 issues a read command to read the detection result of the third detection circuit 123 stored in the data register 122 from the NAND device 20, for example, when the transmission of the special sampling clock whose phase gradually deviates is completed. In addition, the correction sequencer 91 issues a read command to read the detection result of the third detection circuit 123 stored in the data register 122 from the NAND device 20, for example, when the transmission of the special sampling clock whose duty gradually changes is completed.

Then, when rising edges of the toggle signal have deviated from rising edges of the sampling clock based on the detection result of the third detection circuit 123 read from the NAND device 20, the correction sequencer 91 corrects the phase of the toggle signal by changing the set value of the amount of delay of the first delay circuit 64. Similarly, when the rising edges of the toggle signal match the rising edges of the sampling clock but the falling edges of the toggle signal have deviated from the rising edges of the sampling clock, the correction sequencer 91 corrects the duty of the toggle signal by changing the amount of duty adjustment of at least one of the first DCA circuit 61 and the second DCA circuit 65. Thereby, the correction process relating to the data signal is performed.

<4. Flow of Third Correction Process>

Next, a flow of the third correction process will be described.

Figure 9:
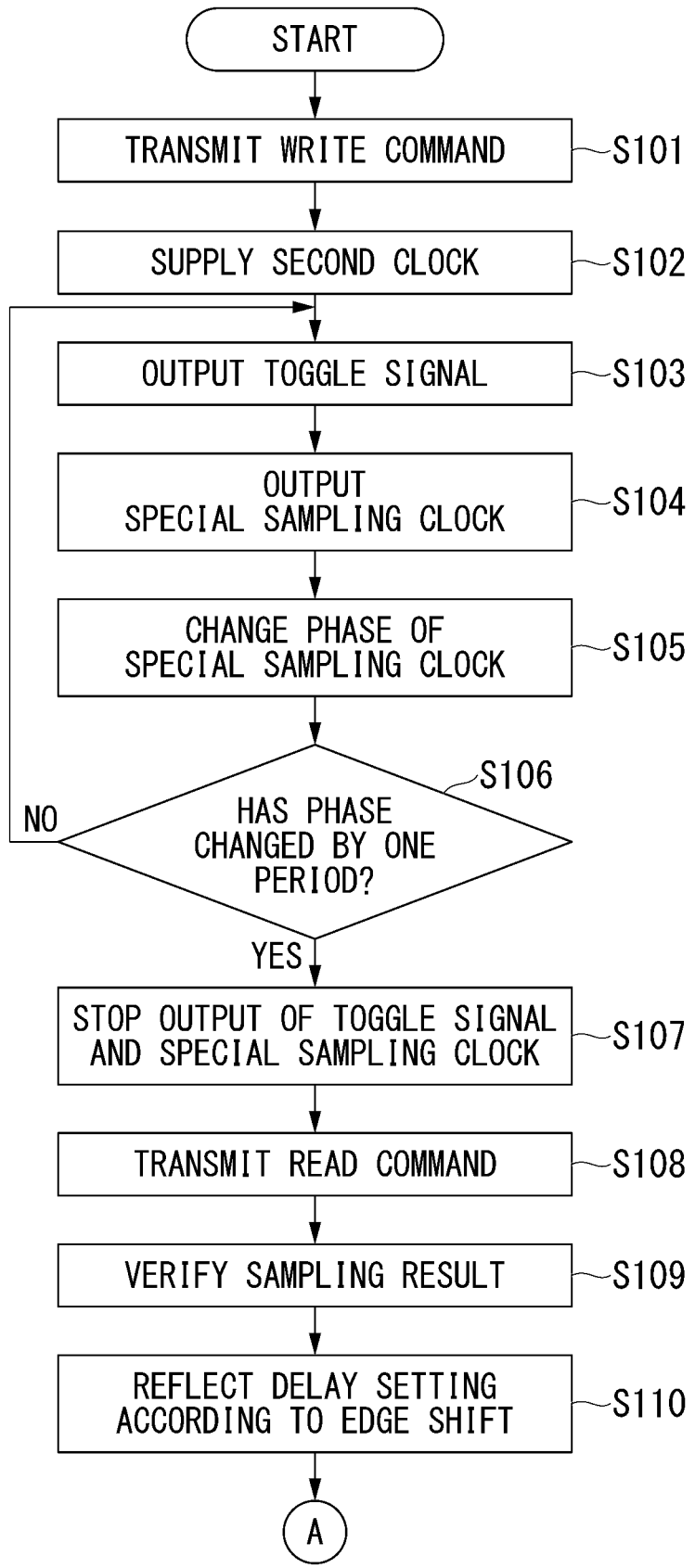
FIG. 9 is a flowchart showing a part of a flow of the third correction process in the first embodiment.
Figure 10:
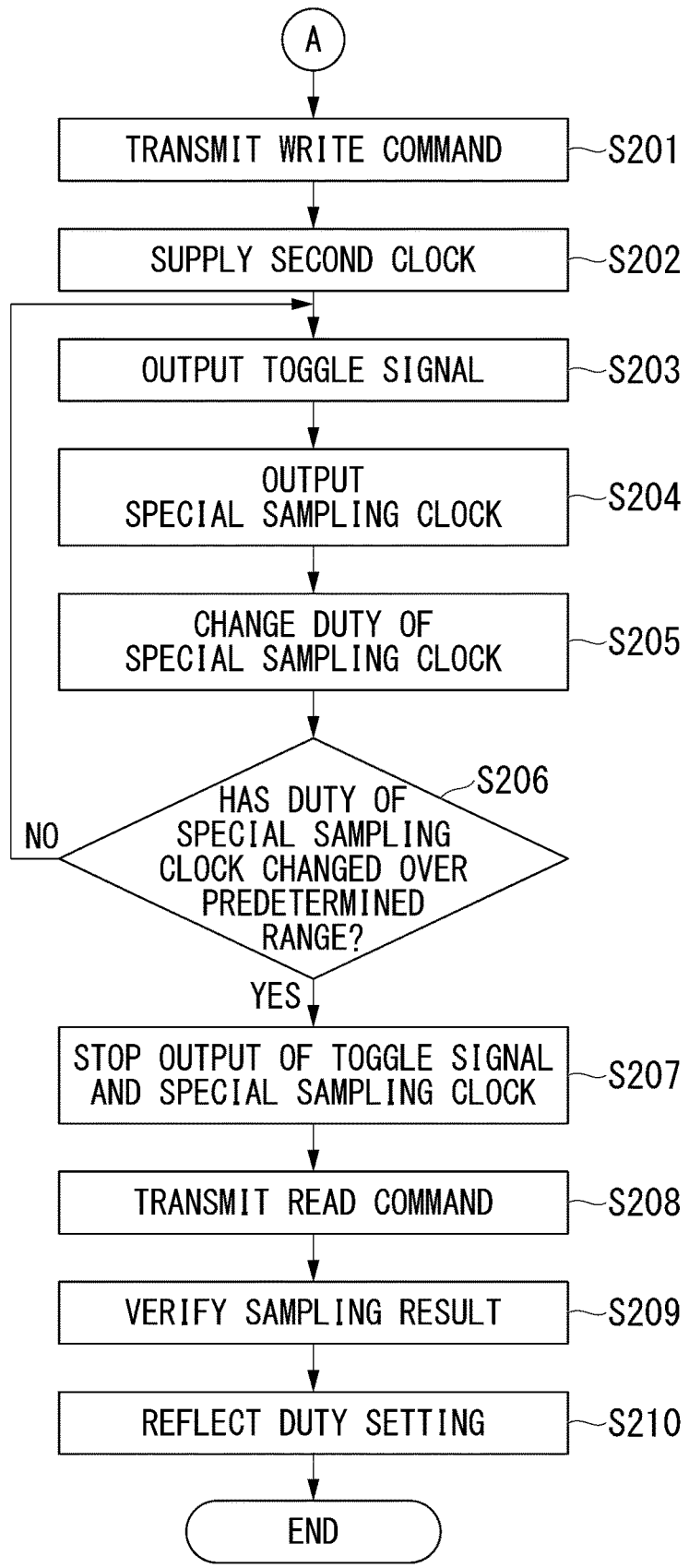
FIG. 10 is a flowchart showing another part of the flow of the third correction process in the first embodiment.

FIGS. 9 and 10 are flowcharts showing the flow of the third correction process. The correction sequencer 91 may perform the first correction process and the second correction process before the third correction process.

First, the correction sequencer 91 outputs a first control command to the command sender CS to cause the command sender CS to transmit a write command to store the detection result of the third detection circuit 123 in the data register 122 of the NAND device 20 to the NAND device 20 (see, S101). This write command is a write command that designates an address included in the data register 122 as a write destination address and designates the detection result of the third detection circuit 123 as write target data.

Next, the correction sequencer 91 outputs a control signal to the multiplexer 54 to switch the multiplexer 54 to the second state. Thereby, the second clock is supplied to the second DDR_FF circuit 72 (see, S102).

Next, the correction sequencer 91 controls the data processing circuit 62 to cause the first DDR_FF circuit 63 to output data indicating a toggle pattern. Thus, the first DDR_FF circuit 63 generates and outputs a toggle signal having the first period using the first clock based on the data indicating the toggle pattern (see, S103).

Next, the correction sequencer 91 controls the data processing circuit 62 to cause the second DDR_FF circuit 72 to output data indicating a sampling clock pattern. Thus, the second DDR_FF circuit 72 generates and outputs a special sampling clock using the second clock based on the data indicating the sampling clock pattern (see, S104).

Next, the correction sequencer 91 changes the set value of the first delay circuit 64. Accordingly, a special sampling clock whose phase has deviated is supplied to the third detection circuit 123 of the NAND device 20 (see, S105).

Next, the correction sequencer 91 determines whether or not the phase has deviated by one period (see, S106). When the phase has not deviated by one period (see, S106: NO), the correction sequencer 91 returns to S103 and repeats the process. Thus, the set value of the first delay circuit 64 gradually changes and a special sampling clock whose phase gradually deviates is supplied to the third detection circuit 123. On the other hand, when the phase has deviated by one period (see, S106: YES), the correction sequencer 91 stops the output of the toggle signal and the special sampling clock by controlling the first and second DDR_FF circuits 63 and 72 (see, S107).

Next, the correction sequencer 91 outputs a second control command to the command sender CS to cause the command sender CS to transmit a read command to read the detection result of the third detection circuit 123 stored in the data register 122 to the NAND device 20 (see, S108).

This read command is a read command in which an address in the data register 122 where the detection result of the third detection circuit 123 is stored is designated as a read destination address.

Next, the correction sequencer 91 verifies the detection result of the third detection circuit 123 read from the NAND device 20 (see, S109). That is, the correction sequencer 91 determines whether or not a rising edge or a falling edge of the toggle signal is present at the timing of each rising edge of a plurality of phases of the special sampling clock.

Then, the correction sequencer 91 identifies a phase of the toggle signal where the rising edges of the special sampling clock match the rising edges of the toggle signal based on the verified detection result. Then, the correction sequencer 91 changes the setting of the amount of delay of the first delay circuit 64 such that the rising edges of the special sampling clock match the rising edges of the toggle signal in the NAND device 20 (see, S110). In other words, the correction sequencer 91 derives and reflects a correction value relating to the amount of delay of the data signal in the first output circuit A1.

Next, as shown in FIG. 10, the correction sequencer 91 performs the same processes as those of S101 to S104 described above as processes of S201 to S204. Next, the correction sequencer 91 changes the set value of at least one of the first DCA circuit 61 and the second DCA circuit 65. Accordingly, a special sampling clock whose duty has changed is supplied to the third detection circuit 123 of the NAND device 20 (see, S205).

Next, the correction sequencer 91 determines whether or not the duty has changed over a predetermined range (see, S206). When the duty has not changed over the predetermined range (see, S206: NO), the correction sequencer 91 returns to S203 and repeats the process. Thus, the set value of the first DCA circuit 61 or the second DCA circuit 65 gradually changes and a special sampling clock whose duty gradually deviates is supplied to the third detection circuit 123. On the other hand, when the duty has changed over the predetermined range (see, S206: YES), the correction sequencer 91 stops the output of the toggle signal and the special sampling clock by controlling the first and second DDR_FF circuits 63 and 72 (see, S207).

Next, the correction sequencer 91 performs the same processes as those of S108 and S109 as processes of S208 and S209. Then, the correction sequencer 91 identifies a duty of the toggle signal where the rising edges of the special sampling clock match the rising edges and falling edges of the toggle signal based on the verified detection result. Then, the correction sequencer 91 changes the setting of the duty of at least one of the first DCA circuit 61 and the second DCA circuit 65 such that the rising edges of the special sampling clock match the rising edges and falling edges of the toggle signal in the NAND device 20 (see, S210). In other words, the correction sequencer 91 derives and reflects a correction value relating to the duty of the data signal in the first output circuit A1.

In the present embodiment, the correction sequencer 91 performs the third correction process described above sequentially on the plurality of NAND devices 20 (for example, the NAND devices 20A and 20B) connected to the NAND Phy 30. Then, the correction sequencer 91 calculates a skew relating to the delay of the data signal with each of the plurality of NAND devices 20 based on the detection result of the third detection circuit 123 read from the plurality of NAND devices 20. Then, the correction sequencer 91 changes the settings of the first delay circuit 64 and the first DCA circuit 61 or the second DCA circuit 65 for each NAND device 20 such that the skew with each of the plurality of NAND devices 20 decreases. A command that the control circuit 90 issues to read the sampling result from the NAND device 20A is an example of a "first command." A command that the control circuit 90 issues to read the sampling result from the NAND device 20B is an example of a "second command." The first command and the second command may be the same or different.

That is, the memory controller 10 individually performs correction processes, (which are, for example, the first to third correction processes or may be only the third correction process) relating to a plurality of NAND devices 20 connected to the same channel ch, sequentially on the plurality of NAND devices 20. For example, when a NAND device 20A and a NAND device 20B are connected to a NAND Phy 30, the NAND Phy 30 first performs correction processes on the NAND device 20A and derives a first correction value of a first output circuit A1 suitable for the NAND device 20A (for example, a set of first correction values relating to duty adjustment circuits 61 and 65 and a delay circuit 64). Next, the NAND Phy 30 performs correction processes on the NAND device 20B and derives a second correction value of the first output circuit A1 suitable for the NAND device 20B (for example, a set of second correction values relating to the duty adjustment circuits 61 and 65 and the delay circuit 64). Then, when performing an operation of writing data into the NAND device 20A as a normal operation, the NAND Phy 30 outputs a data signal through the first output circuit A1 adjusted by the first correction value. On the other hand, when performing an operation of writing data to the NAND device 20B as a normal operation, the NAND Phy 30 outputs a data signal through the first output circuit A1 adjusted by the second correction value. The same is true when three or more NAND devices 20 are connected to one channel ch.

<5. Advantages>

According to such a configuration, a correction value for adjusting a data signal in the NAND Phy 30 can be derived with high accuracy based on a result of detection in the NAND device 20. Thereby, the accuracy of the signal in the NAND device 20 can be improved. As a result, a timing window (a so-called eye pattern) that is a timing margin of the operation clock with respect to the data signal can be widened.

Figure 11:
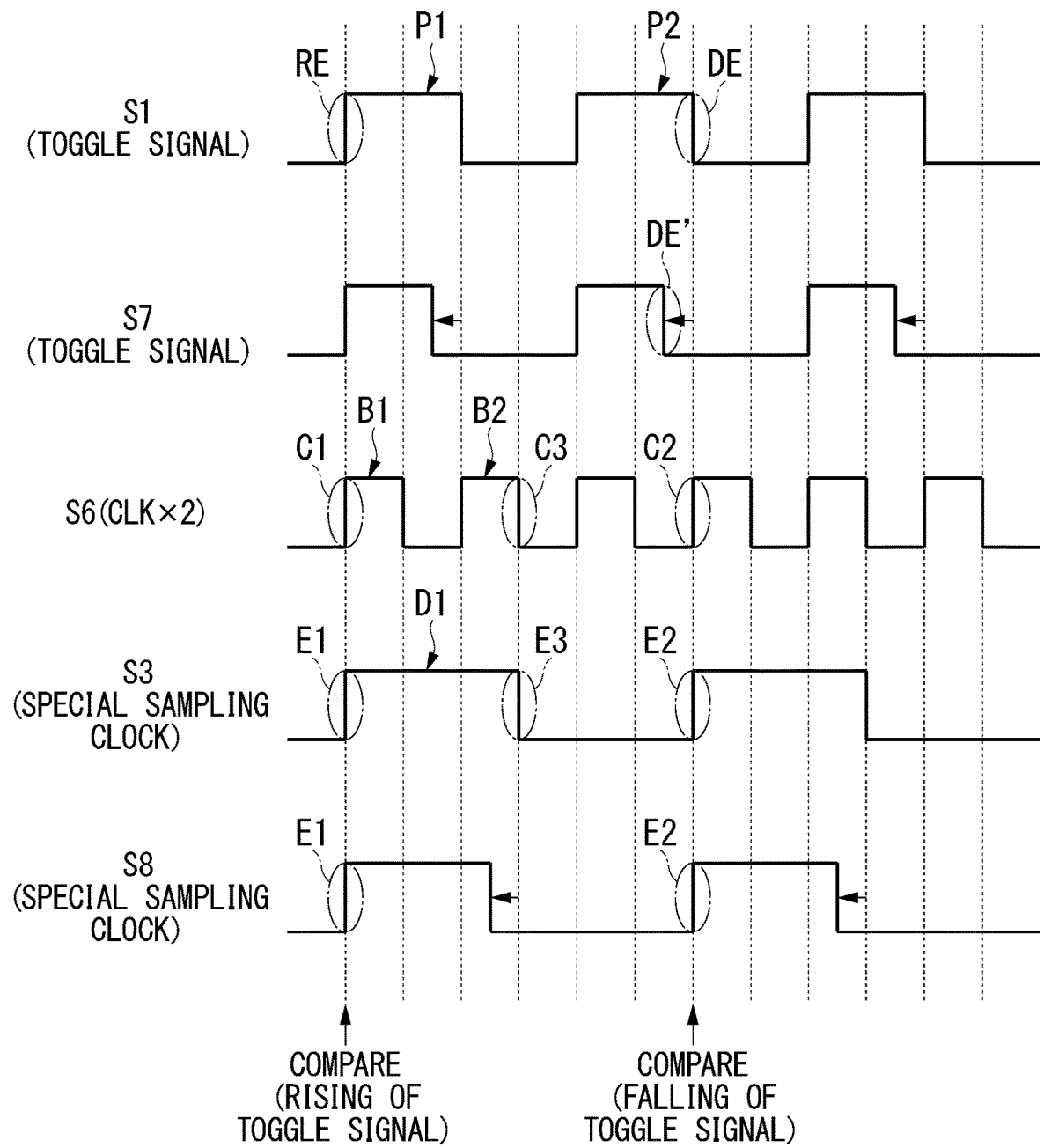
FIG. 11 is a timing chart illustrating examples of advantages of the third correction process in the first embodiment.

FIG. 11 is a timing chart showing examples of advantages of the third correction process of the present embodiment.

In the present embodiment, the second DDR_FF circuit 72 generates a first edge E1 for sampling one rising edge RE included in a toggle signal and a second edge E2 for sampling one falling edge DE included in the toggle signal using rising edges (for example, rising edges C1 and C2) of the second clock in the third correction process.

According to such a configuration, the first edge E1 and the second edge E2 are not easily out of phase even when the duty of the sampling clock has deteriorated before reaching the NAND device 20 (i.e. when falling edges of the sampling clock have deviated to the leading side as shown in S8 of FIG. 11). Therefore, even when the duty of the sampling clock has deteriorated, the rising edge RE and the falling edge DE of the toggle signal can be accurately sampled using the first edge E1 and the second edge E2.

In the present embodiment, the correction sequencer 91 outputs a sampling clock whose phase gradually deviates or a sampling clock whose duty gradually deviates. According to such a sampling clock, the process of detecting the phase or duty of the toggle signal can be realized by one write operation. Thereby, the time required for the correction processes can be shortened.

Here, the memory controller 10 may also include the first and second output circuits A1 and A2 described above provided for each channel ch such that they can simultaneously transmit signals to a plurality of NAND devices 20 connected to different channels ch. In this case, if the phase and duty of a data signal can be adjusted such that the skew with each of the plurality of NAND devices 20 decreases, the reliability of parallel processing on the plurality of NAND devices 20 can be further improved.

The memory controller 10 may use the same sampling clock as the special sampling clock of the third correction process as a sampling clock used for the first and second correction processes. If the sampling clock used for the first and second correction processes is generated by the third DDR_FF circuit 81, such a special sampling clock can be generated.

Second Embodiment

Next, a second embodiment will be described. The second embodiment differs from the first embodiment in the pulse shape of the special sampling clock. Rest of structures other than structures described below are similar to those in the first embodiment. In the present embodiment, a normal flip-flop circuit (i.e. a non-DDR flip-flop circuit) may be provided instead of the third DDR_FF circuit 81.

Figure 12:
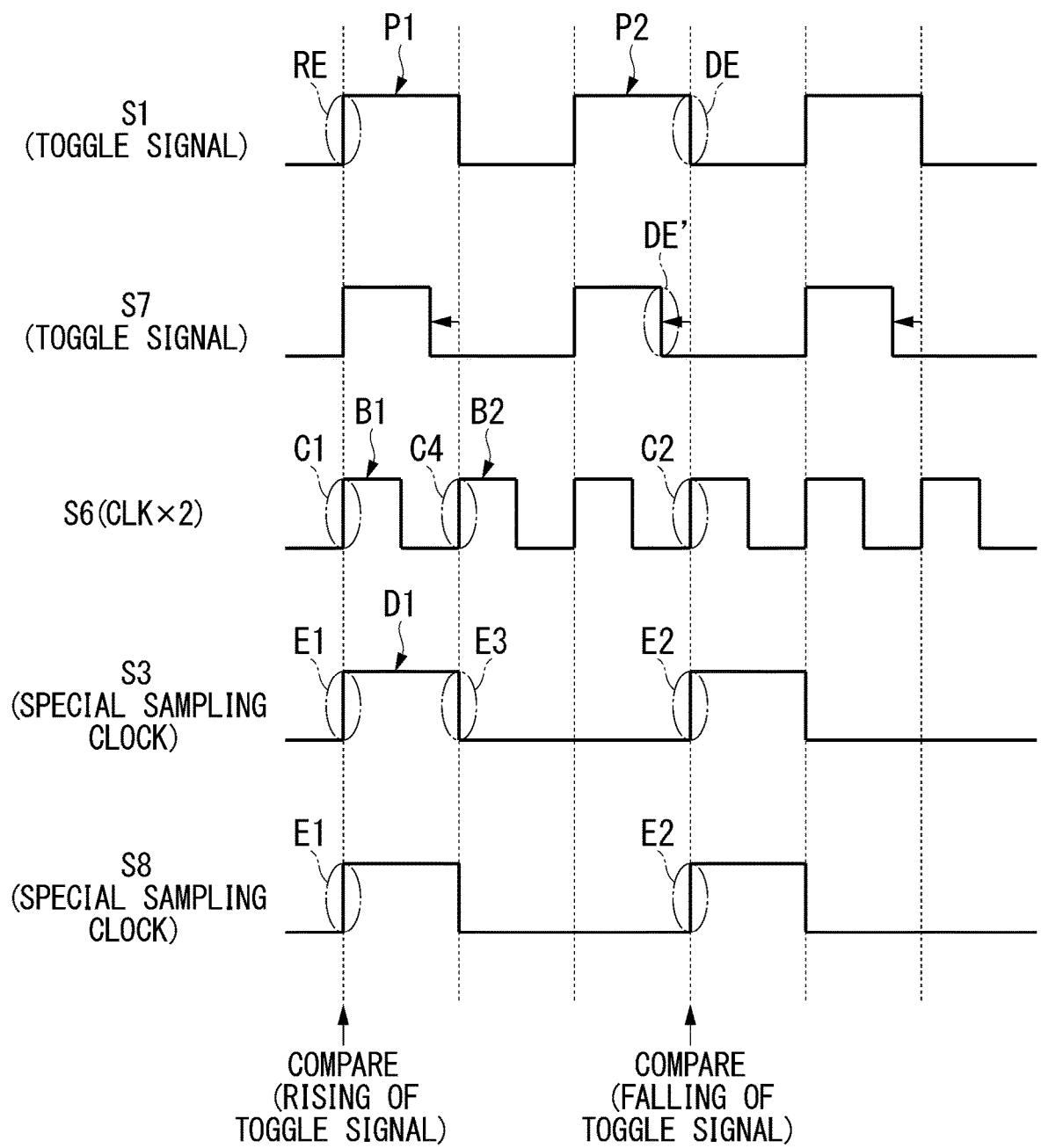
FIG. 12 is a timing chart illustrating a third correction process in a second embodiment.

FIG. 12 is a timing chart illustrating a third correction process in the second embodiment. S3 and S8 in FIG. 12 show an example of a special sampling clock in the second embodiment. The special sampling clock includes a first edge E1 for sampling one rising edge RE included in a toggle signal and a second edge E2 for sampling one falling edge DE included in the toggle signal. The second DDR_FF circuit 72 generates the first edge E1 and the second edge E2 using rising edges (for example, rising edges C1 and C2) of the second clock.

In the present embodiment, the rising edge RE is a rising edge of a first pulse P1 included in the toggle signal. The falling edge DE is a falling edge of a second pulse P2 different from the first pulse P1 (for example, a pulse immediately subsequent to the first pulse P1) included in the toggle signal. The second DDR_FF circuit 72 generates the first edge E1 and the second edge E2 for sampling the rising edge RE and the falling edge DE using rising edges of the second clock.

For example, the special sampling clock includes a plurality of pulses generated by (n+0.5) frequency division (where n is a natural number of 1 or more) of the first period. In the present embodiment, the second DDR_FF circuit 72 generates the rising and falling edges of all pulses of the sampling clock using rising edges of the second clock. In the present embodiment, the second DDR_FF circuit 72 generates one pulse D1 of the special sampling clock based on a rising edge C1 of a first pulse B1 included in the second clock and a rising edge C4 of a second pulse B2 different from the first pulse B1 (for example, a pulse immediately subsequent to the first pulse B1). That is, the second DDR_FF circuit 72 generates the rising edges E1 and E2 of the pulse D1 of the special sampling clock based on the rising edge C1 of the first pulse B1 and generates a falling edge E3 of the pulse D1 of the special sampling clock based on the rising edge C4 of the second pulse B2.

According to such a configuration, falling edges of the sampling clock in addition to rising edges of the sampling clock are generated by rising edges of the second clock. In this case, the duty of the sampling clock is less likely to deteriorate, compared to the first embodiment. Therefore, the detection accuracy of edge positions of the toggle signal in the third correction process may be further improved, compared to the first embodiment.

Although some embodiments have been described above, the embodiments are not limited to the above examples. For example, the second clock may always be supplied to the second output circuit A2. That is, the multiplexer 54 may not be provided.

The above embodiments have been described with reference to an example in which a rising edge and a falling edge of the toggle signal are detected based on the rising edges of the sampling clock. Alternatively, the NAND Phy 30 may detect a rising edge and a falling edge of the toggle signal based on the falling edges of the sampling clock. This can be considered, for example, when an inverting circuit for inverting high/low of the sampling clock is provided.

According to at least one embodiment described above, the semiconductor integrated circuit includes a first output circuit and a second output circuit. The first output circuit generates a signal having a toggle pattern using a clock having a first period and outputs the generated signal having the toggle pattern to the outside. The second output circuit generates a sampling clock using a clock having a second period which is 1/m times the first period, that is, having a frequency which is m times (where m is a natural number of 2 or more), and outputs the generated sampling clock to the outside. According to this configuration, the accuracy of the signal can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form in the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a clock supply circuit configured to be able to output a first clock and a second clock, the first clock having a first period, the second clock having a second period that is 1/m times the first period, where m is a natural number of 2 or more;
   a first output circuit configured to output a first signal indicating content of data to an outside when a first operation is performed and output a second signal having a toggle pattern based on the first clock to the outside when a second operation is performed; and
   a second output circuit configured to output an operation clock based on the first clock to the outside when the first operation is performed and output a sampling clock based on the second clock to the outside when the second operation is performed.

2. The semiconductor integrated circuit according to claim 1, wherein the first operation is an operation of writing the data, and
   the second operation is an operation of deriving a correction value of the first signal in the first output circuit.

3. The semiconductor integrated circuit according to claim 1, wherein the second output circuit is configured to generate the operation clock based on the first clock when the first operation is performed and generate the sampling clock based on the second clock when the second operation is performed.

4. The semiconductor integrated circuit according to claim 1, wherein the sampling clock includes a first edge and a second edge, the first edge being for sampling one rising edge included in the second signal having the toggle pattern, the second edge being for sampling one falling edge included in the second signal, and
   the second output circuit is configured to generate the first edge and the second edge using either rising edges or falling edges of the second clock.

5. The semiconductor integrated circuit according to claim 1, wherein the sampling clock includes a plurality of pulses generated by n+0.5 frequency division of the first period, where n is a natural number of 1 or more.

6. The semiconductor integrated circuit according to claim 1, wherein the second output circuit is configured to generate one pulse of the sampling clock using a rising edge and a falling edge, the rising edge being of a first pulse included in the second clock, the falling edge being of a second pulse different from the first pulse included in the second clock.

7. The semiconductor integrated circuit according to claim 1, wherein the second output circuit is configured to generate rising edges and falling edges of all pulses of the sampling clock using either rising edges or falling edges of the second clock.

8. The semiconductor integrated circuit according to claim 1, wherein the second output circuit includes a first adjustment circuit configured to be able to adjust a phase of the sampling clock and is configured to output the sampling clock whose phase is made to gradually deviate by the first adjustment circuit to the outside.

9. The semiconductor integrated circuit according to claim 8, wherein the second output circuit is configured to continuously output the sampling clock whose phase is made to gradually deviate in a plurality of cycles to the outside in accordance with one write command when the second operation is performed.

10. The semiconductor integrated circuit according to claim 1, wherein the second output circuit includes a second adjustment circuit configured to be able to adjust a duty of the sampling clock and is configured to output the sampling clock whose duty is made to gradually change by the second adjustment circuit to the outside.

11. A transmission device comprising:
    a first terminal configured to be electrically connectable to a semiconductor memory device;
    a second terminal configured to be electrically connectable to the semiconductor memory device;
    a clock supply circuit configured to be able to output a first clock and a second clock, the first clock having a first period, the second clock having a second period that is 1/m times the first period, where m is a natural number of 2 or more;
    a first output circuit configured to output a first signal indicating content of data to the first terminal when a first operation is performed and output a second signal having a toggle pattern based on the first clock to the first terminal when a second operation is performed; and
    a second output circuit configured to output an operation clock based on the first clock to the second terminal when the first operation is performed and output a sampling clock based on the second clock to the second terminal when the second operation is performed.

12. The transmission device according to claim 11, wherein the first operation is an operation of writing the data, and
    the second operation is an operation of deriving a correction value of the first signal in the first output circuit.

13. The transmission device according to claim 11, wherein the second output circuit is configured to generate the operation clock based on the first clock when the first operation is performed and generate the sampling clock based on the second clock when the second operation is performed.

14. The transmission device according to claim 11, wherein the sampling clock includes a first edge and a second edge, the first edge being for sampling one rising edge included in the second signal having the toggle pattern, the second edge being for sampling one falling edge included in the second signal, and
    the second output circuit is configured to generate the first edge and the second edge using either rising edges or falling edges of the second clock.

15. The transmission device according to claim 11, wherein the second output circuit includes a first adjustment circuit configured to be able to adjust a phase of the sampling clock and is configured to output the sampling clock whose phase is made to gradually deviate by the first adjustment circuit to the outside.

16. The transmission device according to claim 11, wherein the second output circuit includes a second adjustment circuit configured to be able to adjust a duty of the sampling clock and is configured to output the sampling clock whose duty is made to gradually change by the second adjustment circuit to the outside.

17. A memory device comprising:
a first semiconductor memory device;
a first terminal electrically connected to the first semiconductor memory device;
a second terminal electrically connected to the first semiconductor memory device;
a clock supply circuit configured to be able to output a first clock and a second clock, the first clock having a first period, the second clock having a second period that is 1/m times the first period, where m is a natural number of 2 or more;
a first output circuit configured to output a first signal indicating content of data to the first terminal when a first operation is performed and output a second signal having a toggle pattern based on the first clock to the first terminal when a second operation is performed;
a second output circuit configured to output an operation clock based on the first clock to the second terminal when the first operation is performed and output a sampling clock based on the second clock to the second terminal when the second operation is performed; and
a control circuit configured to issue a first command to read a sampling result, which has been obtained by performing detection for the second signal using the sampling clock in the first semiconductor memory device and stored in the first semiconductor memory device, from the first semiconductor memory device.

18. The memory device according to claim 17, wherein the control circuit is configured to determine a correction value used to adjust a duty of the first signal based on the sampling result read from the first semiconductor memory device.

19. The memory device according to claim 18, further comprising a second semiconductor memory device,
wherein the first terminal and the second terminal are also electrically connected to the second semiconductor memory device, and
the control circuit is configured to issue a second command to read a sampling result, which has been obtained by performing detection for the second signal using the sampling clock in the second semiconductor memory device and stored in the second semiconductor memory device, from the second semiconductor memory device.

20. The memory device according to claim 17, wherein the first operation includes an operation of writing the data to the first semiconductor memory device and the second operation includes a predetermined correction operation for the first output circuit.

\* \* \* \* \*